(12) United States Patent
Blaum et al.

(10) Patent No.: US 6,226,138 B1
(45) Date of Patent: May 1, 2001

(54) ENCODED TID WITH ERROR DETECTION AND CORRECTION ABILITY

(75) Inventors: Mario Blaum, San Jose; William John Kabelac, Morgan Hill; Mantle Man-Hon Yu, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/162,927

(22) Filed: Sep. 29, 1998

(51) Int. Cl.$^7$ ........................................ G11B 5/09
(52) U.S. Cl. .................................. 360/48; 360/49
(58) Field of Search .......................... 360/48, 49; 369/59

(56) References Cited

U.S. PATENT DOCUMENTS 4,949,200   8/1990   Weng ............................. 360/72.2

OTHER PUBLICATIONS van Zanten, A., Minimal–Change Order and Separability in Linear Codes, IEEE Trans. Info. Theory, 39(6), 1993, pp. 1988–1989.

Primary Examiner—W. Chris Kim
(74) Attorney, Agent, or Firm—Lumen Intellectual Property Services

(57) ABSTRACT

A method of detecting and correcting reading errors of track identification (TID) of a magnetic data storage disk. The method comprises a means of constructing a encoded TID which is derived from generalized Gray code. The encoded TIDs have a distance of D between the adjacent code words, and a distance of at least 2D between non-adjacent code words within a band of M TIDS. The encoded TIDs can correct up to (D–1)/2 errors. The method also comprises means of encoding and decoding TIDS, and means of detecting and correcting errors with encoded TIDs.

7 Claims, 10 Drawing Sheets

ENCODED TID WITH ERROR DETECTION AND CORRECTION ABILITY

FIELD OF THE INVENTION

This invention relates to disk drives that store recorded digital data, and in particular to Track Identification Code (TID) used in data storage disk drives that have the ability to detect and correct reading errors resulting from hardware and software problems.

BACKGROUND

Rotating disk data storage units are commonly used to store data in computer systems. Generally, each disk surface is formatted into a plurality of tracks, each track comprising a plurality of physical sectors. Movable read-write transducer heads positioned proximate to the disk surface are used to record the track and sector formats, and to read data from and write data to each physical sector. An important issue is to correctly and reliably locate the read-write head at any desired track position.

The head of a typical disk drive is generally positioned by means of a servo system. Data on a disk drive is normally stored in a set of concentric tracks on the surface of the rotating disk. Furthermore, the surface of a storage disk drive is radially divided into data regions and servo regions. Thus, each concentric track is also divided into servo regions and data regions. The servo regions and the data regions are normally alternating on the surface of a disk drive (FIG. 1). The data regions are places where data is stored. The servo regions on a track contains address information for the adjacent data regions on the same track. The read-write head locates a desired data track section by moving along the servo region, towards or away from the center of rotation of the disks, and reading a correct address on a servo region on a track. The addresses or track identifications (TIDs) are normally written in the form of Gray codes or modified Gray Codes.

A Gray code is a modified binary code. An important property of a Gray code is that the distance between adjacent code words is only one, wherein the distance between two code words is defined as the number of bits which are different between two code words.

When an error in the TID region occurs, the read-write head will read an address code word that is different from the actual address code word. Consequently, the read-write head may be conveyed to an unintended data section. Thus, a method is required for the disk drive to detect and further correct these erroneous readings. In other words, the addresses must be written on the disk in such a way that even with a number of errors in a retrieved reading, that is, the address as it is read from the disk, the section will still be correctly identified.

A Gray coded TID cannot reliably detect even a single bit error, i.e. a single bit difference between the read code word and the actual code word. A single bit error may cause the read-write head either to move to an adjacent location or to give an erroneous reading, since the distance between the adjacent Gray coded TID is exactly one. With the help of PES bursts, a Gray coded TID can detect a single bit error in an on-track situation, yet cannot detect a single bit error in an off-track situation. This is explained in the following example.

Using a 16-bit Gray code, track 0 is represented by the 16-bit vector 00 . . . 0, track 1 by 00 . . . 01 and track 2 by 00 . . . 11. Assume that the target track is track 2. Then, if the reading head is, say, on track 0, and the bits are correctly read by the head, then it will be correctly concluded that the head is on track 0 and it needs to move. Further, the PES bursts give a means to confirming that the track is an even track. The situation changes when there is an error in the reading, and we read, say, 00 . . . 01 (i.e., an error in the last bit). In this case, this cannot be confused with track 1, since the PES will determine that we are in an even track, so at least an error has occurred. We cannot decide if the correct track is 0 or 2, though, since the read vector is at distance 1 from both 00 . . . 0 and 00 . . . 011. Therefore, for the prior art, one error in the on-track reading can be detected (although cannot be corrected).

In the off-track situation, assume that the head is between tracks 0 and 1. If there are no errors, the reading will be either 00 . . . 0 or 00 . . . 01. This cannot be confused with the target 00 . . . 011. However, assume that an error occurs in the next to last bit and 00 . . . 011 is read. The system will assume that we are on the target track. Clearly, this is not a desirable situation, because errors in the off-track situation may not be detected with the traditional system using Gray code.

One method of achieving error detection property is to add redundant bits to the TID code words. For example, an entire TID may be repeated to form a new code. As a result, when an error occurs in a reading, the redundant bits will not match the original bits. This method enables a disk drive to detect even a single bit error. This method, however, is inefficient because the redundancy is 100% and no error correction is achieved.

L. Weng et. al. describe a method and apparatus for encoding and mapping magnetic disk sector address in U.S. Pat. No. 4,949,200. The purpose of Weng's method is to correctly identify the address even in the presence of errors. The code according to Weng's patent does not assume fixed distance between adjacent code words. However, it is desirable that adjacent code words are at a fixed distance d to allow efficient off-track reading.

In other prior art, the 7 least significant bits of a 16-bit TID is repeated to form the redundant bits. When an error occurs in the reading of the 7 least significant bits, a mismatch is detected when these 7 least significant bits are compared with the redundant bits. Erroneous readings can be detected provided that the error occurs in the 7 least significant bits. On the other hand, an error occurring in the 9 least-significative bits will not be detected by the method. Furthermore, this method does not allow for correction of errors.

A. J. van Zanten, in IEEE Trans. Inform. Theor. 39 (1993) 1988, describes a modification of the Gray codes typically used for TIDs. In his modified Gray codes, adjacent code words differ by d bits, and every code word differs from every other by at least d bits. However, van Zanten does not describe a method for using these codes for encoding TIDs.

In reviewing the prior art, it becomes obvious that a reliable method for detecting and correcting erroneous TID readings in a magnetic storage disk is needed.

OBJECTS AND ADVANTAGES

It is a primary object of the present invention to provide a method for encoding TIDs which has the ability to detect and correct a plurality of bit errors.

It is a further object of the invention to improve the reading reliability in both the on-track and off-track cases.

Further objects and advantages will become apparent from the following description and accompanying drawings.

SUMMARY

These objects are attained by a method of encoding TIDs with Generalized Gray Codes (GGC); recording encoded TIDs in the servo section on the surface of disk drives; subsequently reading these encoded TIDs with a read head; decoding read encoded TIDs and correcting errors in the decoding process.

In order to correct errors in the on-track reading, we need that the tracks are encoded into codewords at distance at least d from each other. Thus, up to (d−1)/2 errors will be corrected. In our preferred embodiment, d=3, so one error will be corrected. In addition, to allow for off-track reading, we require that adjacent tracks be encoded in such a way that the corresponding codewords be at distance exactly d from each other. A generalized Gray code is defined as a code having code words $\underline{G}(i)$, wherein adjacent code words $\underline{G}(i)$ and $\underline{G}(i+1)$ are at distance exactly d from each other, non-adjacent codewords are at a distance greater than or equal to d from each other, and code words $\underline{G}(2i)$ and $\underline{G}(2i+3)$ are at distance exactly d from each other. Note that the property that the distance between $\underline{G}(2i)$ and $\underline{G}(2i+3)$ is exactly d differentiates the generalized Gray codes used here from the modified Gray codes of van Zanten, referred to previously. It is our purpose to utilize GGCs with $d \geq 3$.

So, assume that the tracks use TIDs that are encoded using a GGC with $d \geq 3$. What happens with the on-track reading? Certainly, if we read a track and up to (d−1)/2 errors occur, they will be corrected by the code. The PES will further confirm if the read TID corresponds to an even or odd track, providing for additional detection in case the error-correcting capability of the code is exceeded. So, let us analyze the off-track case.

We will do it with an example, in which we'll assume that d=3, track 0 is represented by the vector 00000, track 1 by vector 11100, and track 2 by vector 01111 (notice, adjacent vectors are at distance 3). Let us assume that our target track is track 2, and the head is between tracks 0 and 1. In the absence of errors, any of the following eight readings are possible: abc00, where a, b, c, can be either 0 or 1. In any case, these readings will be interpreted as either track 0 or track 1. The PES will determine if the corresponding track is even or odd. However, assume that there is an error in one of the last two bits and we read the vector 01110. In this case, the vector will be decoded as 01111, which corresponds to our target track 2. The PES will further confirm that we are in an even track, therefore, we will erroneously conclude that we have attained our target. Clearly, this situation is not desirable. In order to correct and/or detect errors when reading off-track, we need to require that non-adjacent TIDs be at distance at least 6 from each other (in general, distance of 2d from each other).

It turns out that requiring distance at least 2d for non-adjacent TIDs is excessive. Some drive mechanics limit head movement, so in practice we require that non-adjacent codewords be at least more than or equal to 2d from each other within a predetermined band of tracks. Outside the band, it is enough that they be at distance at least d from each other. In our preferred embodiment, we will require the following:

1. Adjacent TIDs are at distance 3 from each other.
2. Non-adjacent TIDs within a band of at most 127 codewords are at distance at least 6 from each other.
3. Any pair of TIDs are at distance at least 3 from each other.

A band is defined as follows: two non-adjacent tracks i and j are within a band of M tracks if either $2 \leq j-i \leq M$ or $2 \leq i-j \leq M$. For example, when i equals 10, j equals 90, M equals 127, track 10 and track 90 are within a band of 127 since $2 \leq j-i \leq 127$. This property significantly reduces the likelihood of erroneous decoding, and allows for one bit error correction even in an off-track location. The minimum width M of a band of TIDs at distance 2D or more, is determined by the maximum number of tracks the system can move the head within one servo sample.

We propose the following form for the encoded TIDs:

$$(\underline{U}(1), \underline{X}(0)); (\underline{U}(1), \underline{X}(1)); (\underline{U}(2), \underline{X}(1)); (\underline{U}(2), (\underline{X})(2)); \ldots; (\underline{U}(2^k), \underline{X}(2^k - 1)); (\underline{U}(2^k), \underline{X}(0));$$

$$(\underline{U}(2^k + 1), \underline{X}(0)); (\underline{U}(2^k + 1), \underline{X}(1)); \ldots; (\underline{U}(2^{k+1}), \underline{X}(2^k - 1)); (\underline{U}(2^{k+1}), \underline{X}(0))$$

$$\ldots$$

$$(\underline{U}(2^h - 2^k + 1), \underline{X}(0)); (\underline{U}(2^h - 2^k + 1), \underline{X}(1)); \ldots; (\underline{U}(2^h - 1), \underline{X}(2^k - 1)); (\underline{U}(0), \underline{X}(2^k - 1)); (\underline{U}(0), \underline{X}(0));$$

$$(\underline{U}(3), \underline{X}(0)); (\underline{U}(3), \underline{X}(1)); (\underline{U}(4), \underline{X}(1)); (\underline{U}(4), (\underline{X})(2)); \ldots; (\underline{U}(2^k + 2), \underline{X}(2^k - 1)); (\underline{U}(2^k + 2), \underline{X}(0));$$

$$(\underline{U}(2^k + 3), \underline{X}(0)); (\underline{U}(2^k + 3), \underline{X}(1)); (\underline{U}(2^k + 4), \underline{X}(1)); \ldots; (\underline{U}(2^{k+1} + 2), \underline{X}(2^k - 1); (\underline{U}(2^{k+1} + 2), \underline{X}(0));$$

$$\ldots$$

$$(\underline{U}(2^h - 2^k + 3), \underline{X}(0)); (\underline{U}(2^h - 2^k + 3), \underline{X}(1)); (\underline{U}(2^h - 2^k + 4), \underline{X}(2)); \ldots; (\underline{U}(2), \underline{X}(2^k - 1)); (\underline{U}(2), \underline{X}(0));$$

$$\ldots$$

$$(\underline{U}(2^k - 1), \underline{X}(0)); (\underline{U}(2^k - 1), \underline{X}(1)); (\underline{U}(2), \underline{X}(1)); \ldots; (\underline{U}(2^{k+1} - 1)\underline{X}(2^k - 1)); (\underline{U}(2^{k+1} - 1), \underline{X}(0));$$

$$(\underline{U}(2^{k+1}), \underline{X}(0)); (\underline{U}(2^{k+1}), \underline{X}(1)); (\underline{U}(2^{k+1}), \underline{X}(1)); \ldots; (\underline{U}(2^{k+2} - 1), \underline{X}(2^k - 1)); (\underline{U}(2^{k+2} - 1), \underline{X}(0));$$

$$\ldots$$

$$(\underline{U}(2^h - 1), \underline{X}(0)); (\underline{U}(2^h - 1), \underline{X}(1)); (\underline{U}(0), \underline{X}(1)); (\underline{U}(0), \underline{X}(2)); \ldots; (\underline{U}(2^k - 2), \underline{X}(2^k - 1)); (\underline{U}(2^k - 2), \underline{X}(0))$$

wherein $\underline{U}(i)$ and $\underline{X}(j)$ are code vectors which are encoded in a Generalized Gray Code (GGC). $\underline{U}(i)$ is a first set of a number of $2^h$ GGC code words and $X(j)$ is a second set of $2^k$ GGC code words.

We use GGCs whose code words $\underline{G}(i)$ have the following properties: the Hamming distance between adjacent code words $\underline{G}(i)$ and $\underline{G}(i+1)$ is exactly D; the distance between code words $\underline{G}(2i)$ and $\underline{G}(2i+3)$ is exactly D; and the distance between any pair of code words $\underline{G}(i)$ and $\underline{G}(j)$, where i j, is at least D.

The sequence of encoded TIDs is constructed, using 9 sets of vectors $\underline{u}(i), \underline{x}(j), \underline{uu}(i), \underline{xx}(j), \underline{U}(i), \underline{X}(j), \underline{A}, \underline{B},$ and $\underline{C}$, via a number of transformations comprising the following steps:

1) Let m be a track number, where $0 \leq m \leq 2^n - 1$. Let k+h equal where $h \geq k$. Assign a pair (i,j) to m in the following way:

to m=0, assign (1,0), to m=1, assign (1,1), to m=2, assign (2,1), to m=3, (2,2), etc. such that the assignment follows the following sequence:

$(1,0);(1,1);(2,1);(2,2); \ldots ;(2^k,2^k-1); (2^k, 0); (2^k+1,0);(2^k+1,1); \ldots ; (2^{k+1},2^k-1);(2^{k+1},0)$ $(2^h-2^k+1,0); (2^h-2^k+1,1); \ldots ; (2^h-1,2^k-1); (0,2^k-1);(0,0); (3,0); (3,1); (4,1); (4,2); \ldots ; (2^k+2,2^k-1); (2^k+2, 0); (2^k+3, 0); (2^k+3,1); (2^k+4,1); \ldots ; (2^{k+1}2,2^k-1); (2^{k+1}+2,0);$ $(2^1-2^k+3,0); (2^1-2^k+3,1); (2^1-2^k+4,2); \ldots ;(2, 2^k-1); (2, 0); (2^k-1,0); (2^k-1,1); (2^k,1); \ldots ; (2^{k+1}-1,2^k-1); (2^k-1,0); (2^{k+1}-1,0); (2^{k+1},1); (2^{k+1}+1,1); \ldots ; (2^{k+2}-1,2^k-1); (2^{k+2}-1,0);$ $(2^h-1,0); (2^h-1,1); (0,1); (0,2); \ldots ; (2^k-2, 2^k-1); (2^k-2,0)$ Let the k-bit vector $\underline{x}(j)=(x_0(j), x_1(j), \ldots, x_{k-1}(j))$ be the binary representation of j, and the h-bit vector $\underline{u}(i)=(u_0(i), u_1(i), \ldots, u_{h-1}(i))$ be the binary representation of i. Combine $\underline{u}(i)$ and $\underline{x}(j)$ to form a set of vectors $\underline{A}=(\underline{u}(i), \underline{x}(j))$.

2) Obtain a set of vectors $\underline{B}=(\underline{uu}(i), \underline{xx}(j))$ by converting $\underline{u}(i)$ and $\underline{xx}(j)$ into Gray coded vectors $\underline{uu}(i)$ and $\underline{xx}(j)$ respectively, having a distance of 1 between adjacent $\underline{uu}(i)$ and $\underline{xx}(j)$ respectively, and between $\underline{uu}(2i)$ and $\underline{uu}(2i+3)$ and $\underline{xx}(2j)$ and $\underline{xx}(2j+3)$ respectively.

3) Obtain a set $\underline{C}=(\underline{U}(i), \underline{X}(j))$ by converting $\underline{uu}(i)$ and $\underline{xx}(j)$ into Hamming coded vectors $\underline{U}(i)$ and $\underline{X}(j)$ respectively, having said predetermined distance of D between adjacent code words in $\underline{u}(i)$ and $\underline{x}(j)$ respectively by using systematic parity-check matrices such that the columns of the non-systematic part have weight D−1.

The encoding of a binary information vector $(m_0, m_1, \ldots, m_{n-1})$, which is represented by a code vector $\underline{m}$, to said encoded TID comprises the following steps of:

1) Separating said information code $\underline{m}$ into two segments $(m_0, m_1, \ldots, m_{h-1})$ and $(m_h, m_{h+1}, \ldots, m_{n-1})$, where n−h=k.

2) Obtaining a corresponding $\underline{u}=(u_0, u_1, \ldots, u_{h-1})$ from the first h bits of the regular sum of $(m_{k-1}, m_{k+1}, \ldots, m_{n-2})$ and $(m_0, m_1, \ldots m_{k-2}, 1)$ as binary numbers; Obtaining a corresponding $\underline{x}=(x_0, x_1, \ldots, x_{k-1})$ from the first k-bits of the regular sum of $(m_{h-1}, m_h, \ldots, m_{n-2})$ and $m_{n-1}$ as binary numbers;

Forming an n-bit vector $\underline{A}=(\underline{u},\underline{x})$, where $\underline{u}$, $\underline{x}$ are code words of $\underline{u}(i)$, $\underline{x}(j)$, respectively.

3) Converting $\underline{u}$ and $\underline{x}$ into Gray Code $\underline{uu}$ and $\underline{xx}$ respectively, forming an n-bit vector $\underline{B}=(\underline{uu},\underline{xx})$, where $\underline{uu}$, $\underline{xx}$ are code words of $\underline{uu}(i)$, $\underline{xx}(j)$ respectively;

4) converting $\underline{Uu}$ and $\underline{Xx}$ into generalized Gray codes $\underline{U}$ and $\underline{X}$ respectively, using systematic parity-check matrices such that the non-systematic part of the parity-check matrices of the Hamming codes have weight D−1.

The decoding of encoded TID comprises the following steps:

1) Decoding two generalized Gray codes $\underline{U}$ and $\underline{X}$ separately into Gray Codes $\underline{uu}$ and $\underline{xx}$.

2) Decoding two Gray Codes $\underline{uu}$ and $\underline{xx}$ separately into binary codes $\underline{u}$ and $\underline{x}$.

3) Transforming pair $(\underline{u},\underline{x})$ into a binary code word $\underline{m}$.

A detailed explanation of a preferred embodiment of the invention, such as the encoding method, the decoding method and the error detecting and correcting process is contained in the detailed specification with reference to the appended drawing figures.

DETAILED DESCRIPTION

Figure 1:
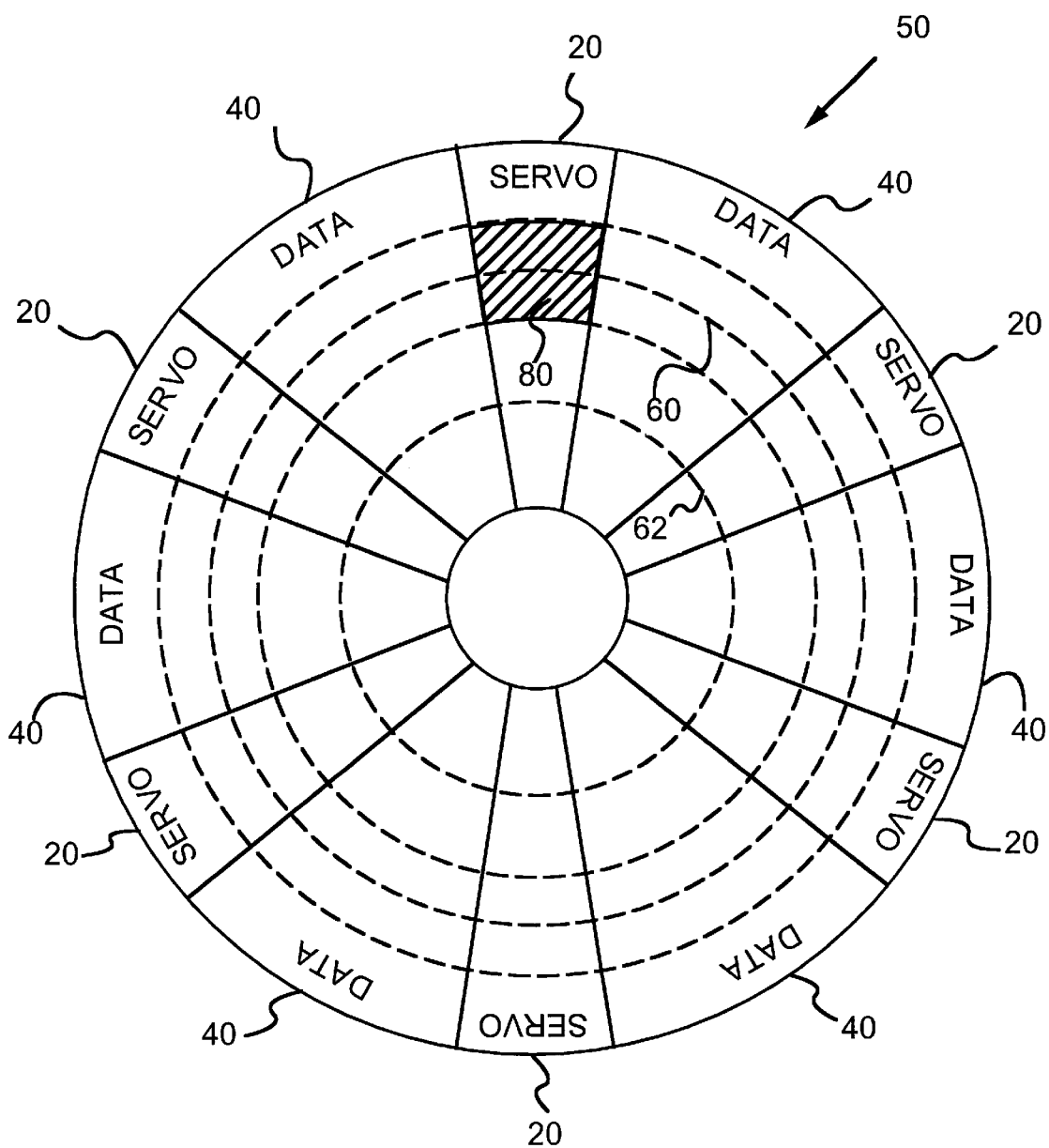
FIG. 1 is a schematic diagram of a surface of a magnetic or optical data storage disk.

Magnetic recording disk drives incorporate stacked, commonly-rotated rigid magnetic recording disks that are used for storage of user data. The schematic structure of a magnetic disk 50 is shown in FIG. 1. A surface of disk 50 comprises concentric tracks where information is stored. Tracks 60 and 62 are two of these tracks. Recording heads are moved by an actuator in a generally radial path toward and away from the center of rotation of the disk to read and write data on the disks.

It is necessary to know the precise radial and circumferential location of the recording heads relative to their associated disk surfaces. Radial position information is recorded on the disk as servo information and is used to position the heads at the desired data tracks and maintain the heads over the desired data tracks during read and write operations. As illustrated in FIG. 1, the surface of disk 50 is radially divided into alternating data sectors 40 and servo sectors 20. Data sectors 40 are locations where user data is recorded. Servo sectors 20 are locations where servo information is stored. In order to further illustrate the detailed structure of servo sector 20, a highlighted portion 80 of servo sector 20 is shown in FIG. 2.

Figure 2:
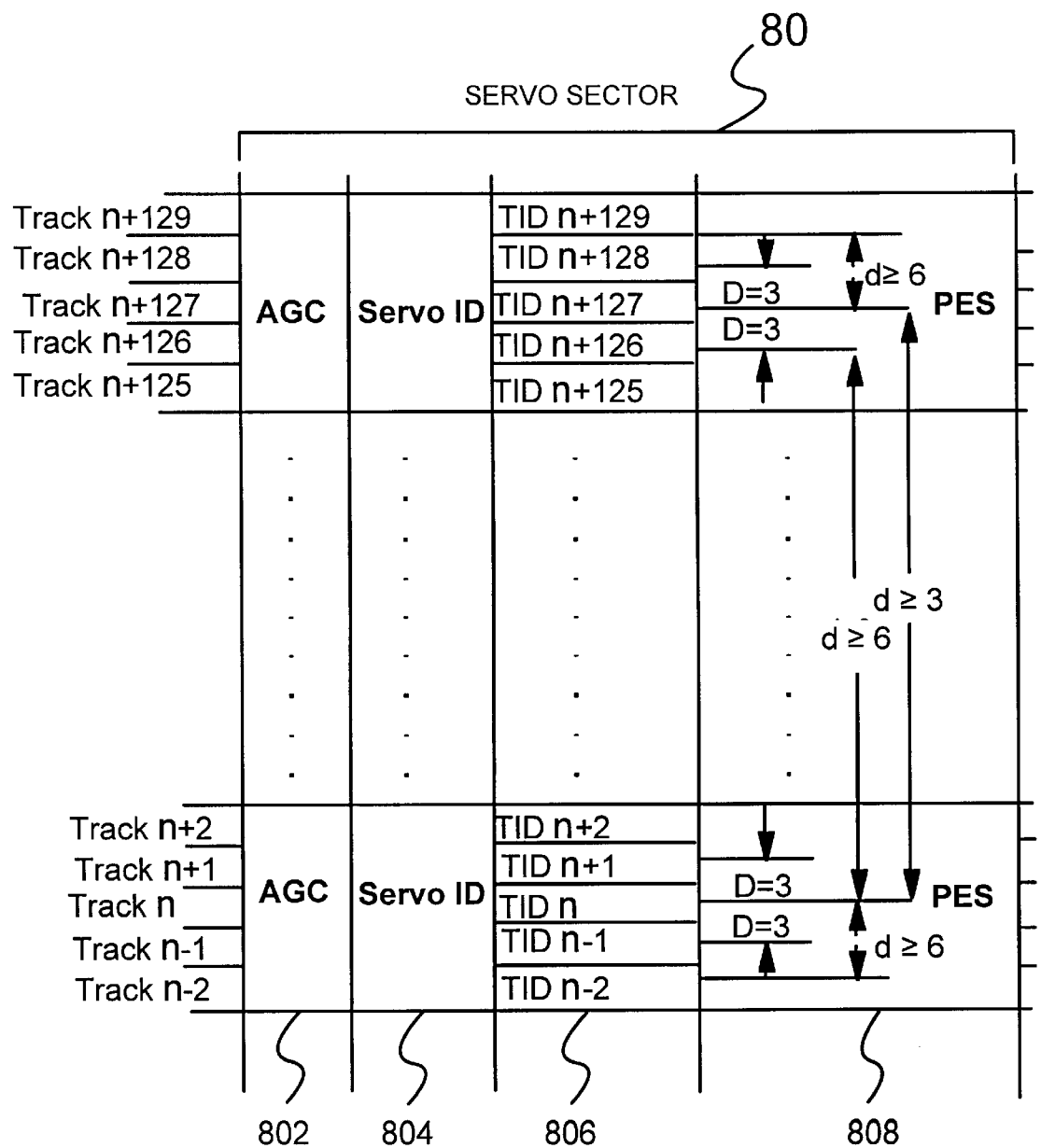
FIG. 2 is a schematic of a portion of a servo sector.

A detailed structure of a portion 80 of servo sector 20 according to preferred embodiment of the invention is shown in FIG. 2. The preamble field 802 is shown as an automatic gain control (AGC) field. The preamble field 802 is a constant frequency signal, typically an all "ones" pattern, that is used to distinguish the STM pattern from the prior fields, and is also typically used to adjust the gain of the read amplifier and is necessary for the accurate reading of servo information. The Servo ID 804 is used for data synchronization, and also to store some specific information, such as even or odd sector, index or non-index sector etc. The PES field 808 contains very accurate radial position information that is used to precisely align the head for data read and data write operations. The TID field 806 contains the encoded TIDs which will be explained in detail below.

In the preferred embodiment, the encoded TIDs in the TID field 806 have the following properties: The adjacent encoded TIDs have a distance D of 3, which means that there is exactly a 3-bit difference between two adjacent TIDs. Two encoded TIDs which are not adjacent and are within a band of 127 TID codes away from each other, are at a distance d of at least 6 from each other. Any two encoded TIDs are at a distance d of at least 3 from each other, regardless of where they are.

Construction of Encoded Tids

The encoded TIDs in this embodiment are constructed using 9 sets of vectors $\underline{u}(i)$, $\underline{x}(j)$, $\underline{uu}(i)$, $\underline{xx}(j)$, $\underline{U}(i)$, $\underline{X}(j)$, $\underline{A}$, B, and C, via a number of transformations comprising the following steps of:

1) Taking a set of 6-bit vectors $\underline{x}(j)=(x_0(j), x_1(j), \ldots, x_5(j))$, and a set of 10-bit vectors $\underline{u}(i)=(u_0(i), u_1(i), \ldots, u_9(i))$, where i represents an integer number between 0 and 1023, and j represents an integer number between 0 and 63.

2) Constructing a sequence of a number of $2^{16}$ 16-bit vectors $\underline{A}$ by:
   i) Combining $\underline{u}(i)$ and $\underline{x}(j)$ to form vectors $\underline{A}=(\underline{u}(i), \underline{x}(j))$, and
   ii) Arranging said set of vectors $\underline{A}$ according to the following order of (i, j):

(1,0);(1,1);(2,1);(2,2); . . . ; (63,63);(64,63); (64,0); (65,0); (65,1);(66,1); . . . ; (127,63);(128,63);(128,0);
(961,0);(961,1);(962,1);(962,2); . . . ; (1023,62);(1023,63);
(0,63);(0,0); (3,0);(3,1);(4,1);(4,2); . . . ;(65,63);(66,63);(66, 0); (67,0);(67,1);(68,0); . . . (129,63);(130,63);(130,0);
(963,0);(963, 1);(964, 1);(964,2); . . . ;(1,62);(I,63);(2,63); (2,0);
(63,0);(63,1);(64,1);(64,2); . . . ;(125,63);(126,63);(126,0); (127,0);(127,1);(128,1); . . . ;(189,63);(190,63);(190,0);
(1023,0);(1023,1);(0,1);(0,2); . . . ;(61,62);(61,63);(62,63); (62,0)

TABLE 1

We have the following correspondence between vectors $\underline{A}$ and pairs $(\underline{U}(i), \underline{X}(j))$:

| | | |
|---|---|---|
| $\underline{A}_0 \leftrightarrow$ | 0000000001 | 000000 |
| $\underline{A}_1 \leftrightarrow$ | 0000000001 | 000001 |
| $\underline{A}_2 \leftrightarrow$ | 0000000010 | 000001 |
| . . . . . . . . . | | |

3) Obtaining a set of vectors $\underline{B}$, where $\underline{B}=(\underline{uu}(i), \underline{xx}(j))$ by converting $\underline{u}(i)$ and $\underline{x}(j)$ into Gray coded vectors $\underline{uu}(i)$ and $\underline{xx}(j)$ respectively, having a distance of 1 between adjacent $\underline{uu}(i)$ and $\underline{xx}(j)$ respectively, and a distance of 1 between $\underline{uu}(2i)$ and $\underline{uu}(2i+3)$, and $\underline{xx}(2i)$ and $\underline{xx}(2i+3)$ respectively.

4) Obtaining a set $\underline{C}=(\underline{U}(i), \underline{X}(j))$ by converting $\underline{uu}(i)$ and $\underline{xx}(j)$ into Hamming coded vectors $\underline{U}(i)$ and $\underline{X}(j)$ respectively, having said predetermined distance of 3 between adjacent code words in $\underline{U}(i)$ and $\underline{X}(j)$ respectively. Furthermore, there is a distance of 3 between $\underline{U}(2i)$ and $\underline{U}(2i+3)$. There is also a distance of 3 between $\underline{X}(2i)$ and $\underline{X}(2i+3)$.

5) Obtaining encoded TIDs as $\underline{C}$.

When constructed, the encoded TIDs are recorded in the servo sectors on the surface of a data storage disk, such as the one shown in FIG. 1.

Definitions

The following definitions are used. A Gray code is a set of code words wherein each code word differs from its predecessor by one binary bit. The Gray code $\underline{uu}(i)$ has the additional property that $\underline{uu}(2i)$ differs from $\underline{uu}(2i+3)$ by one bit. The Gray code $\underline{xx}(i)$ also has the property that $\underline{xx}(2i)$ differs from $\underline{xx}(2i+3)$ by one bit.

A generalized Gray code (GGC) is a set of code words $\underline{G}(i)$ wherein adjacent codewords $\underline{G}(i)$ and $\underline{G}(i+1)$ differ by D binary bits, non-adjacent code words differ by at least D binary bits, and code words $\underline{G}(2i)$ and $\underline{G}(2i+3)$ differ by exactly D binary bits. The set of $\underline{U}(i)$ and the set of $\underline{X}(j)$ are generalized Gray codes.

A distance between two code words is equal to the number of binary bits by which the two code words differ; that is, the distance is defined as the Hamming distance. Hence, a generalized Gray code is a set of code words $\underline{G}(i)$ wherein the distance between adjacent code words is D, the distance between non-adjacent code words is at least D, and the distance between $\underline{G}(2i)$ and $\underline{G}(2i+3)$ is D.

Because a generalized Gray code always has a distance D associated with it, a generalized Gray code is called more precisely a "generalized Gray code of distance D." Thus, in the preferred embodiment, the set of $\underline{U}(i)$ is a generalized Gray code of distance 3.

In the present method and apparatus, an encoded track identification, or encoded TID, is written as a pair of code words of generalized Gray code: $(\underline{U}(i), \underline{X}(j))$. The encoded TIDs have the following properties: the distance between adjacent TIDs is equal to D; the distance between non-adjacent TIDs that lie within a band of M TIDs is at least 2D; and the distance between any two TIDs is at least D. The $n^{th}$ TID and a non-adjacent $m^{th}$ TID lie within a band of M TIDs if and only if $2 \leq |n-m| \leq M$. In the preferred embodiment, D=3 and M=127.

Encoding Process

The encoding process comprises transforming a binary information code word into the encoded TIDs, which is derived from the Generalized Gray Code (GGC). The detailed steps are described in as follows:

Take a 16-bit vector $\underline{m}=(m_0, m_1, \ldots, m_{15})$. The vector $\underline{m}$ represents a binary number m, $0 \leq m \leq 2^{16}-1$. The first step is transforming vector $\underline{m}$ into a 16-bit vector $\underline{n}=(n_0, n_1, \ldots, n_{15})$, such that $(n_0, n_1, \ldots, n_9)$ represents a vector $\underline{u}(i)$ which corresponds to a number i between 0 and 1023; and $(n_{10}, n_{11}, \ldots, n_{15})$ represents a vector $\underline{X}(j)$ which corresponds to a number j between 0 and 63. The 1-1 correspondence between m and this pair of numbers is given by Table 1. For instance, 0 corresponds to the pair (1,0), 1 to the pair (1,1), 2 to the pair (2,1), etc. If we write the corresponding vectors in binary, we obtain 0000000000000000 ⇆ 0000000001 000000
0000000000000001 ⇆ 0000000001 000001
0000000000000010 ⇆ 0000000010 000001

Vector $(n_0, n_1, \ldots, n_9)$ is obtained by taking the first 10 bits of the addition of the binary vectors $(m_5, m_6, \ldots, m_{14})$ and $(m_0, m_1, \ldots, m_4, 1)$. For example, let $\underline{m}=(1101100110010000)$, where m equals 55696. Then we have $\underline{u}(i)=(0011111111)$, where i equals 255. Vector (n10, n11, . . . , n15) is the regular sum as binary numbers of $(m_9, m_{10}, \ldots m_{14})$ and $m_{15}$. In the same example, for $\underline{m}=(1101100110010000)$, then $\underline{x}(j)=(001000)$, where j equals 8.

Figure 3:
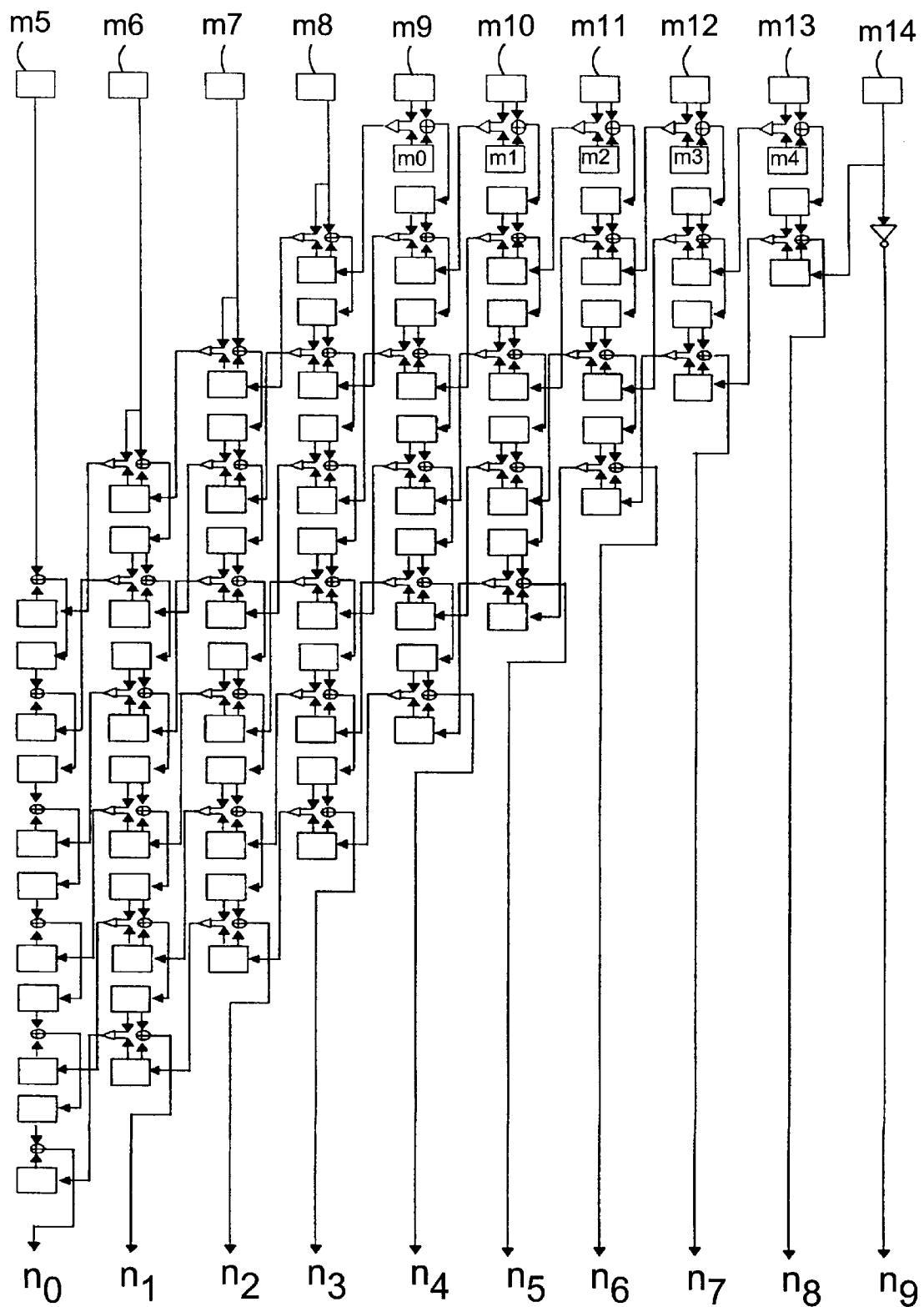
FIG. 3 is an encoding circuit for code vectors u(i).
Figure 4:
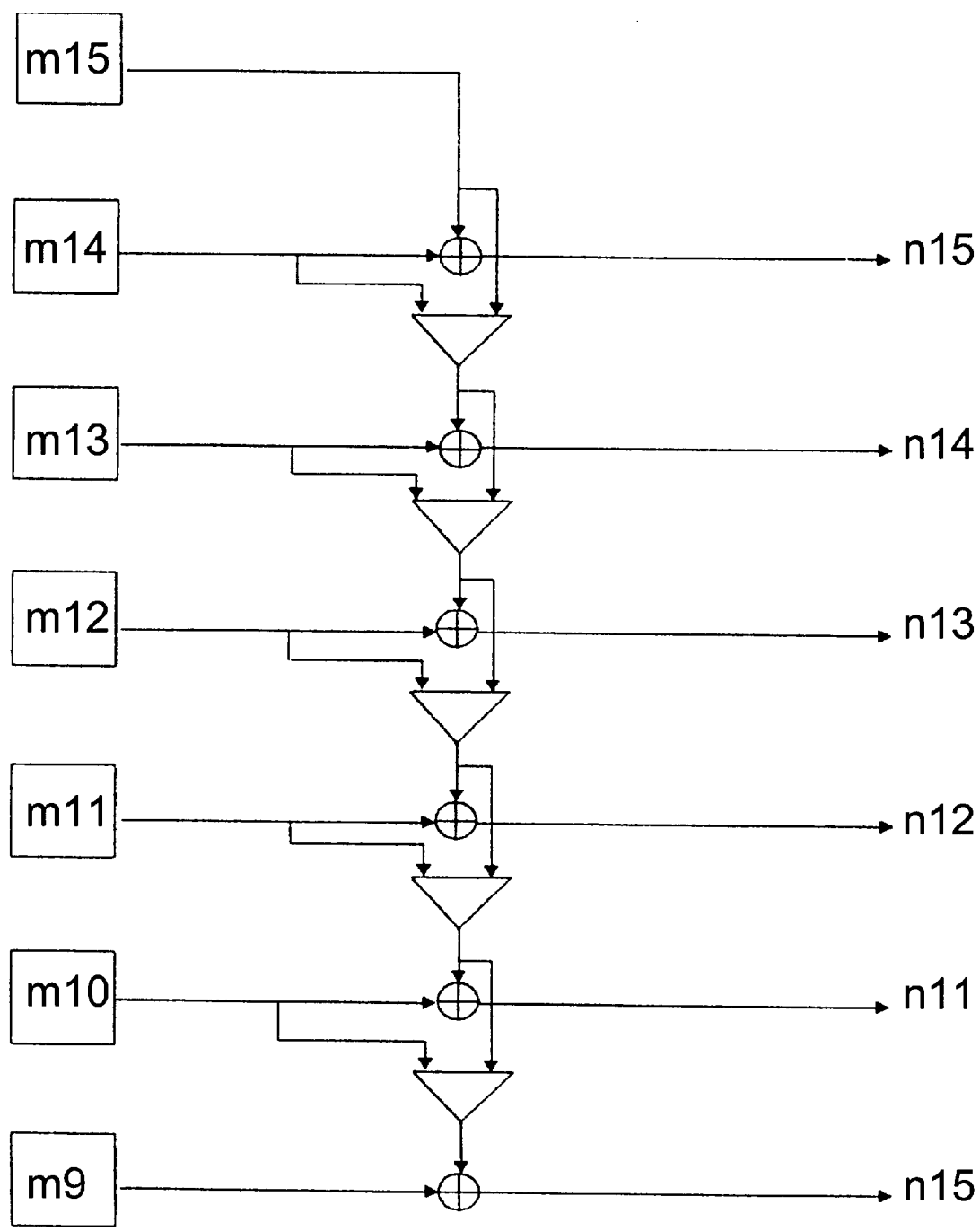
FIG. 4 is an encoding circuit for code vectors x(j).

In summary, the first step in the encoding process is, given the input vector $\underline{m}=(m_0, m_1, \ldots m_{15})$, to produce the vector $\underline{n}=(n_0, n_1, \ldots n_{15})=(\underline{u}(i), \underline{x}(j))$, where $\underline{u}(i)$ and $\underline{x}(i)$ are given by the circuits of FIG. 3 and FIG. 4 respectively.

Secondly, $\underline{u}(i)$ and $\underline{x}(i)$ are encoded into Gray codes separately. So, given $n=(n_0, n_1, \ldots n_{15})$, the Gray coded vector $B=(B_0, B_1, \ldots, B_{15})$ is obtained by the following transformation:

$B_0=n_0$
$B_{10}=n_{10}$
$B_i=n_{i-1} \ominus n_i$, for $1 \leq i \leq 15$, i 10.

$(B_0, B_1, \ldots, B_9)$ and $(B_{10}, B_{11}, \ldots, B_{15})$ are then encoded into $(C_0, C_1, \ldots C_{14})$ and $(C_{15}, C_{16}, \ldots C_{24})$ separately according to the Hamming code defined by two parity-check matrices containing the identity-matrix, and the columns in the parity-check matrix that do not correspond to said identity matrix having a weight of exactly 2. The corresponding two matrices are:

$$\begin{bmatrix} 111100000010000 \\ 100011100001000 \\ 010010011000100 \\ 001001010100010 \\ 000100101100001 \end{bmatrix} = H1$$

and, $$\begin{bmatrix} 1110001000 \\ 1001100100 \\ 0101010010 \\ 0010110001 \end{bmatrix} = H2$$

Figure 5:
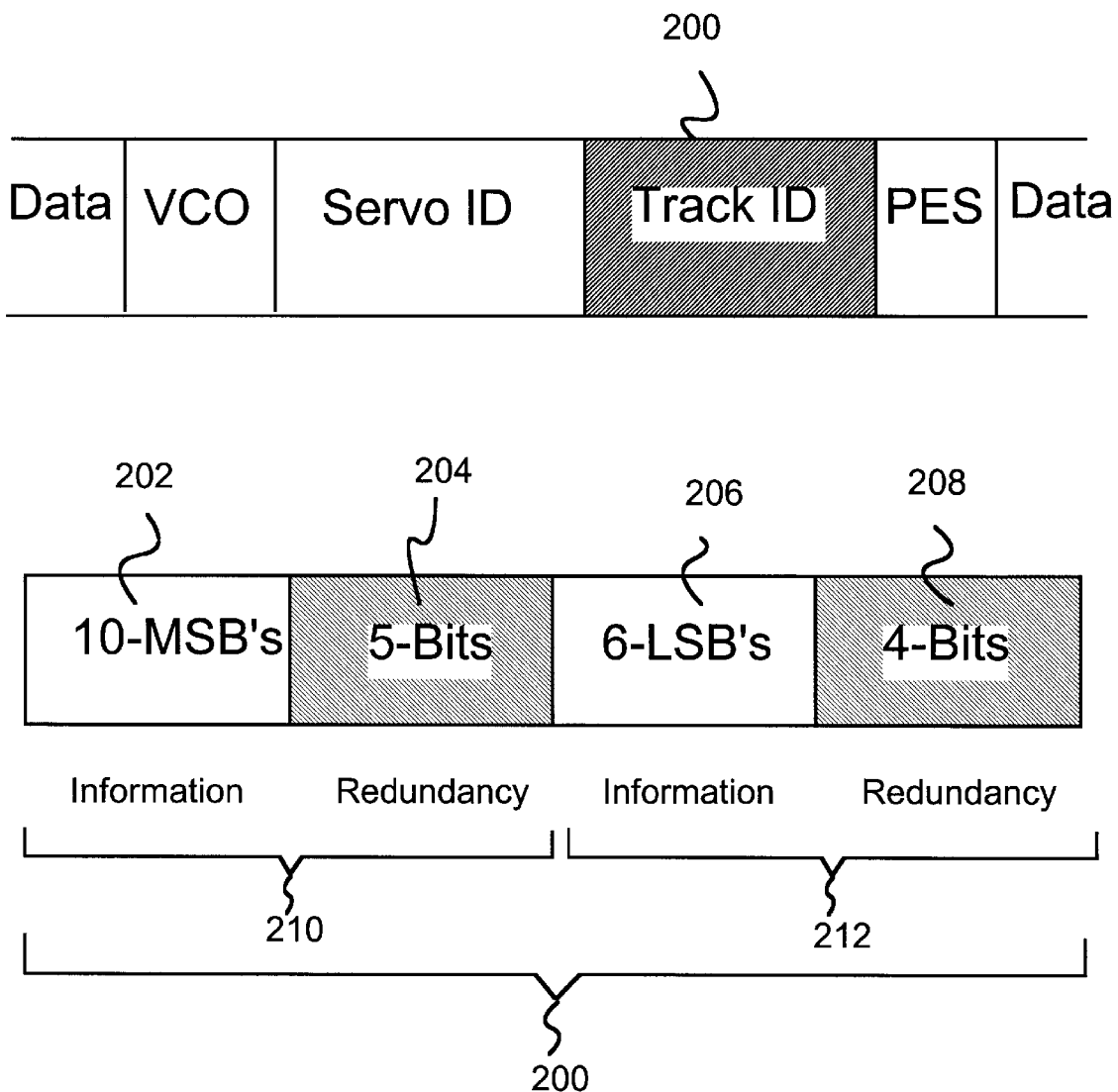
FIG. 5 is a schematic of an encoded TID of a servo section of a track.

Specifically, the encoding logic is the following:
$C_i=B_i$ for $0 \leq i \leq 9$
$C_{10}=B_0 \ominus B_1 \ominus B_2 \ominus B_3$
$C_{11}=B_0 \ominus B_4 \ominus B_5 \ominus B_6$
$C_{12}=B_1 \ominus B_4 \ominus B_7 \ominus B_8$
$C_{13}=B_2 \ominus B_5 \ominus B_7 \ominus B_9$
$C_{14}=B_3 \ominus B_6 \ominus B_8 \ominus B_9$
$C_i=B_{i-5}$ for $15 \leq i \leq 20$
$C_{21}=B_{10} \ominus B_{11} \ominus B_{12}$
$C_{22}=B_{10} \ominus B_{13} \ominus B_{14}$
$C_{23}=B_{11} \ominus B_{13} \ominus B_{15}$
$C_{24}=B_{12} \ominus B_{14} \ominus B_{15}$ This concludes the logic of the encoding process. The resulting code $\underline{C}$ is recorded as the encoded TID which is shown in FIG. 5. 200 is the encoded Track ID in a servo sector on a track of a disk. Encoded TID 200 is composed of two portions, 210 and 212, where the former is the GGC coded 15 bit vector U, and the latter is the GGC coded 10 bit vector X. U comprises a portion of 10 information bits 202, and a portion of 5 redundancy bits 204. Similarly, X comprises a portion of 6 information bits 206, and a portion of 4 redundancy bits 208. In this embodiment, a 16-bit information TID is transformed into a 25-bit encoded TID.

Decoding Process

A decoding process, at the reception of a pair of vectors $\underline{U}$ and $\underline{X}$, which is a possible noisy version of an encoded TID, comprises: decoding separately the two received vectors $\underline{U}$ and $\underline{X}$ with respect to their corresponding codes and obtaining $\underline{Uu}$ and $\underline{xx}$ as a result of this decoding. If a one bit error occurs in $\underline{U}$, which means that the retrieved code $\underline{U}'$ is at a distance of 1 from the correct code $\underline{U}$, then $\underline{U}'$ is correctly decoded as $\underline{U}$, and the output of the decoder will give the correct location corresponding to $(\underline{U},\underline{X})$. On the other hand, if a bit error occurs in $\underline{X}$, then a vector $(\underline{U},\underline{X}')$ is retrieved, wherein $\underline{X}'$ is at a distance of 1 from $\underline{X}$. The decoder will correctly decode $\underline{X}'$ as $\underline{X}$, then the output of the decoder will give the correct location corresponding to $(\underline{U}, \underline{X})$.

If a one bit error occurs in $\underline{U}$ and another one bit error occurs in $\underline{X}$, then a vector $(\underline{U}',\underline{X}')$ is received by the decoder. The decoder will decode $\underline{U}'$ as $\underline{U}$, and $\underline{X}'$ as $\underline{X}$. The output of the decoder will give the correct location corresponding to $(\underline{U},\underline{X})$. When a two bit error occurs in $\underline{U}$, then $(\underline{U}',\underline{X})$ is received by the decoder, wherein $\underline{U}'$ is at a distance of 2 from $\underline{U}$. Two things may happen when the decoder attempts to decode: one, the decoder obtains an illegal syndrome, and an uncorrectable error is detected; two, there is a legal code word $\underline{U}''$ which is at a distance of 1 from $\underline{U}'$, and the output of the decoder is $(\underline{U}'',\underline{X})$. The location corresponding to this vector, though, is not within the band of 127 vectors above and below $(\underline{U},\underline{X})$. This will be detected as an error by the system. If a two bit error occurs in $\underline{X}$, the process is similar.

The detailed decoding process is explained as follows:

The decoder receives as input a vector $\underline{C}$ which is represented by $(C_0, C_1, \ldots, C_{24})$. The first step is decoding the vectors $(C_0, C_1, \ldots, C_{14})$ and $(C_{15}, C_{16}, \ldots, C_{24})$ with respect to the parity-check matrices $H_1$ and $H_2$ respectively. The output of the first decoder is a Gray-encoded vector $(B_0, B_1, \ldots B_9)$, while the output of the second decoder is a Gray-encoded vector $(B_{10}, B_{11}, \ldots B_{15})$. The Gray-encoded vectors are transformed, using an inverse Gray function, into the two vectors $(n_0, n_1, \ldots n_9)$ and $(n_{10}, n_{11}, \ldots n_{15})$. Finally, the vector $\underline{n}$ is transformed into an estimate of the input vectors $\underline{m}$, by providing an inverse function of $\underline{u}(i)$ and $\underline{x}(j)$.

The detailed logic is given next:

Let us start with the decoders with respect to $H_1$ and $H_2$. The first step is finding the syndromes $s=(s_0, s_1, s_2, s_3, s_4)$ and $S=(S_0, S_1, S_2, S_3)$, where $s_0=C_0 \ominus C_1 \ominus C_2 \ominus C_3 \ominus C_{10}$
$s_1=C_0 \ominus C_4 \ominus C_5 \ominus C_6 \ominus C_{11}$
$s_2=C_1 \ominus C_4 \ominus C_7 \ominus C_8 \ominus C_{12}$
$s_3=C_2 \ominus C_5 \ominus C_7 \ominus C_9 \ominus C_{13}$
$s_4=C_3 \ominus C_6 \ominus C_8 \ominus C_9 \ominus C_{14}$
$S_0=C_{15} \ominus C_{16} \ominus C_{17} \ominus C_{21}$
$S_1=C_{15} \ominus C_{18} \ominus C_{19} \ominus C_{22}$
$S_2=C_{16} \ominus C_{18} \ominus C_{20} \ominus C_{23}$
$S_3=C_{17} \ominus C_{19} \ominus C_{20} \ominus C_{24}$ Next, we find the error vectors $e=(e_0, e_1, \ldots, e_9)$ and $E=(E_0, E_1, \ldots E_5)$. The logic performing these operations are given by:

$e_0=s_0 \wedge s_1 \wedge \bar{s}_2 \wedge \bar{s}_3 \wedge \bar{s}_4$
$e_1=s_0 \wedge \bar{s}_1 \wedge s_2 \wedge \bar{s}_3 \wedge \bar{s}_4$
$e_2=s_0 \wedge \bar{s}_1 \wedge \bar{s}_2 \wedge s_3 \wedge \bar{s}_4$
$e_3=s_0 \wedge \bar{s}_1 \wedge \bar{s}_2 \wedge \bar{s}_3 \wedge s_4$
$e_4=\bar{s}_0 \wedge s_1 \wedge s_2 \wedge \bar{s}_3 \wedge \bar{s}_4$
$e_5=\bar{s}_0 \wedge s_1 \wedge \bar{s}_2 \wedge s_3 \wedge \bar{s}_4$
$e_6=\bar{s}_0 \wedge s_1 \wedge \bar{s}_2 \wedge \bar{s}_3 \wedge s_4$
$e_7=\bar{s}_0 \wedge \bar{s}_1 \wedge s_2 \wedge s_3 \wedge \bar{s}_4$
$e_8=\bar{s}_0 \wedge \bar{s}_1 \wedge s_2 \wedge \bar{s}_3 \wedge s_4$
$e_9=\bar{s}_0 \wedge \bar{s}_1 \wedge \bar{s}_2 \wedge s_3 \wedge s_4$ (1)

and $E_0=S_0 \wedge S_1 \wedge \bar{S}_2 \wedge \bar{S}_3$
$E_1=S_0 \wedge \bar{S}_1 \wedge S_2 \wedge \bar{S}_3$
$E_2=S_0 \wedge \bar{S}_1 \wedge \bar{S}_2 \wedge S_3$
$E_3=\bar{S}_0 \wedge S_1 \wedge \bar{S}_2 \wedge S_3$
$E_4=\bar{S}_0 \wedge S_1 \wedge \bar{S}_2 \wedge S_3$
$E_5=\bar{S}_0 \wedge \bar{S}_1 \wedge S_2 \wedge S_3$ (2)

The codes given by $H_1$ and $H_2$ have an error detection capability. With respect to $H_1$, if the syndrome s has weight 3, 4 or 5, then an uncorrectable error is detected, while with respect to $H_2$, if the syndrome S has weight 3 or 4, then an uncorrectable error is detected. Let us give the logic to perform these operations next.

Consider:

$$e_{10}=s_0 \wedge \bar{s}_1 \wedge \bar{s}_2 \wedge \bar{s}_3 \wedge \bar{s}_4$$

$$e_{11}=\bar{s}_0 \wedge s_1 \wedge \bar{s}_2 \wedge \bar{s}_3 \wedge \bar{s}_4$$

$$e_{12}=\bar{s}_0 \wedge \bar{s}_1 \wedge s_2 \wedge \bar{s}_3 \wedge \bar{s}_4$$

$$e_{13}=\bar{s}_0 \wedge \bar{s}_1 \wedge \bar{s}_2 \wedge s_3 \wedge \bar{s}_4$$

$$e_{14}=\bar{s}_0 \wedge \bar{s}_1 \wedge \bar{s}_2 \wedge \bar{s}_3 \wedge s_4$$

$$e_{\infty}=\bar{s}_0 \wedge \bar{s}_1 \wedge \bar{s}_2 \wedge \bar{s}_3 \wedge \bar{s}_4$$

and $$E_6=S_0 \wedge \bar{S}_1 \wedge \bar{S}_2 \wedge \bar{S}_3$$

$$E_7=\bar{S}_0 \wedge S_1 \wedge \bar{S}_2 \wedge \bar{S}_3$$

$$E_8=\bar{S}_0 \wedge \bar{S}_1 \wedge S_2 \wedge \bar{S}_3$$

$$E_9=\bar{S}_0 \wedge \bar{S}_1 \wedge \bar{S}_2 \wedge S_3$$

$$E_{\infty}=\bar{S}_0 \wedge \bar{S}_1 \wedge \bar{S}_2 \wedge \bar{S}_3 \qquad (4)$$

using (1), (2), (3), and (4), let $$r_1 = e_0 \vee e_1 \vee \ldots \vee e_{14} \vee e_{28}$$

$$r_2 = E_0 \vee E_1 \vee \ldots \vee E_9 \vee E_{\infty}$$

we will detect an uncorrectable error if the syndromes corresponding to H1 or to H2 do not correspond to at most one error in each, or if each code has corrected exactly one error. We then obtain, $$r = r_1 \wedge r_2$$

Then, if r=0, we declare an uncorrectable error. Otherwise, we produce the vector (B0, B1, . . . B15) as output of the decoders as follows:

$$B_i = C_i \ominus e_i \text{ for } 0 \leq i \leq 9$$

$$B_{10+j} = C_{15+j} \ominus E_j \text{ for } 0 \leq j \leq 5$$

The vectors $(B_0, B_1, \ldots B_9)$ and $(B_{10}, B_{11}, \ldots B_{15})$ are Gray-encoded. We need to apply a Gray-decoder in order to obtain the corresponding vectors $(n_0, n_1, \ldots n_9)$ and $(n_{10}, n_{11}, \ldots n_{15})$. The logic of this Gray decoder is as follows:

$$n_0=B_0$$

$$n_1=B_0 \ominus B_1$$

$$n_2=B_0 \ominus B_1 \ominus B_2$$

$$n_3=B_0 \ominus B_1 \ominus B_2 \ominus B_3$$

$$n_4=B_0 \ominus B_1 \ominus B_2 \ominus B_3 \ominus B_4$$

$$n_5=B_0 \ominus B_1 \ominus B_2 \ominus B_3 \ominus B_4 \ominus B_5$$

$$n_6=B_0 \ominus B_1 \ominus B_2 \ominus B_3 \ominus B_4 \ominus B_5 \ominus B_6$$

$$n_7=B_0 \ominus B_1 \ominus B_2 \ominus B_3 \ominus B_4 \ominus B_5 \ominus B_6 \ominus B_7$$

$$n_8=B_0 \ominus B_1 \ominus B_2 \ominus B_3 \ominus B_4 \ominus B_5 \ominus B_6 \ominus B_7 \ominus B_8$$

$$n_9=B_0 \ominus B_1 \ominus B_2 \ominus B_3 \ominus B_4 \ominus B_5 \ominus B_6 \ominus B_7 \ominus B_8 \ominus B_9$$

$$n_{10}=B_{10}$$

$$n_{11}=B_{10} \ominus B_{11}$$

$$n_{12}=B_{10} \ominus B_{11} \ominus B_{12}$$

$$n_{13}=B_{10} \ominus B_{11} \ominus B_{12} \ominus B_{13}$$

$$n_{14}=B_{10} \ominus B_{11} \ominus B_{12} \ominus B_{13} \ominus B_{14}$$

$$n_{15}=B_{10} \ominus B_{11} \ominus B_{12} \ominus B_{13} \ominus B_{14} \ominus B_{15} \qquad (5)$$

Figure 6:
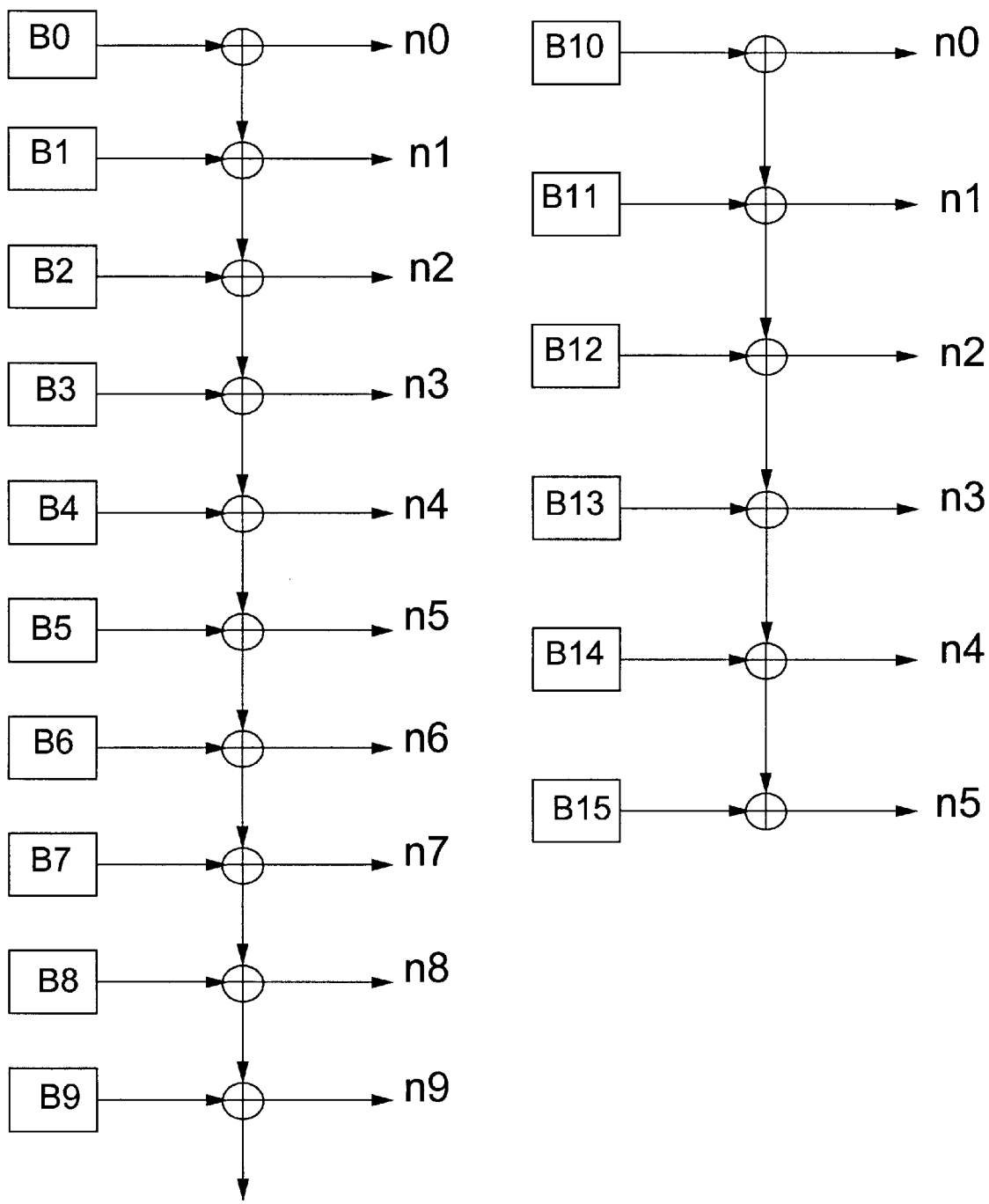
FIG. 6 is a decoding circuit for vectors b(i).

Efficient circuits implementing the inverse Gray function according to (5) are given in FIG. 6.

Figure 7:
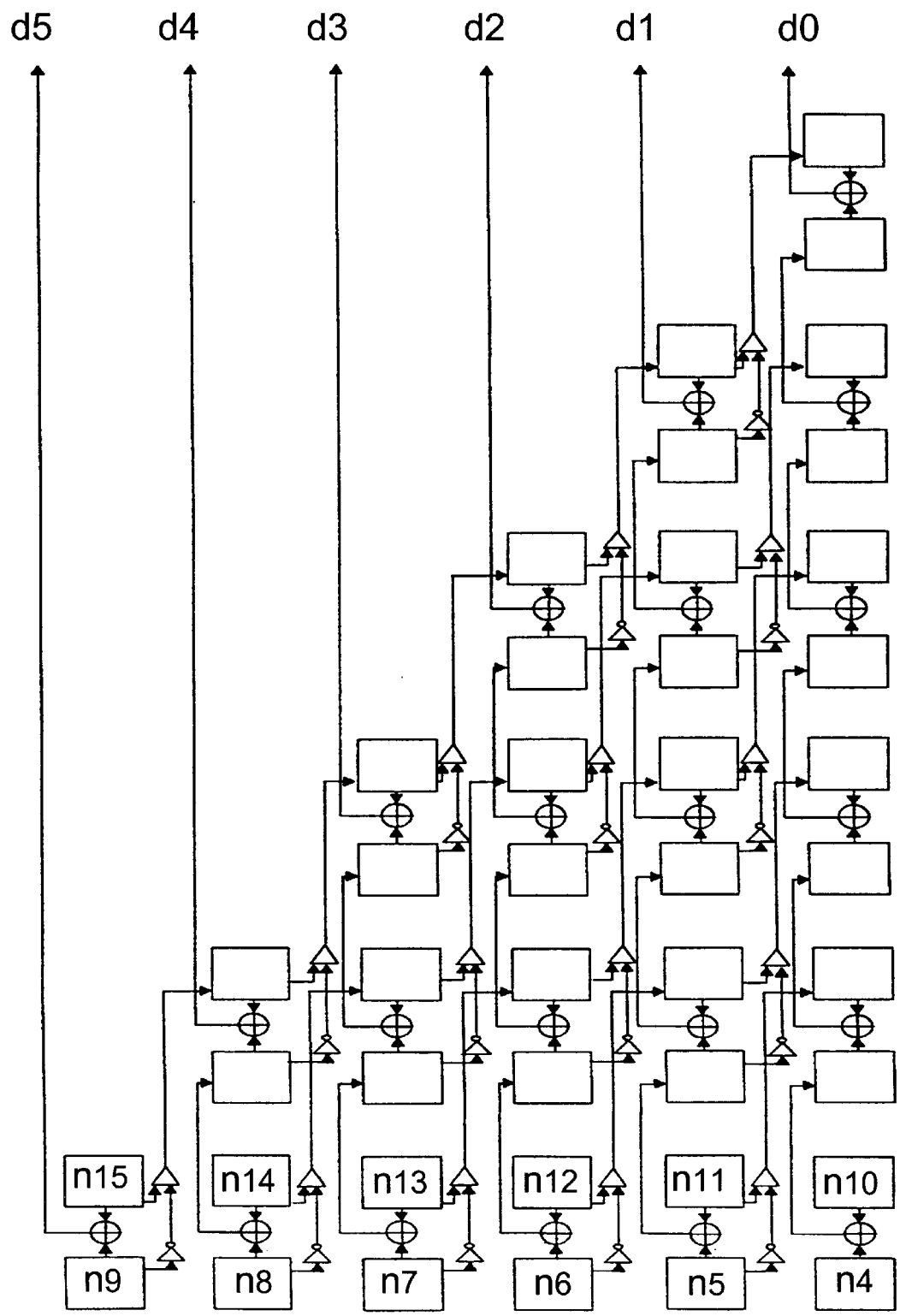
FIG. 7 is a circuit implementing the subtraction of $(n_{10}, n_{11}, \ldots, n_{15})$ from $(n_4, n_5, \ldots, n_9)$.
Figure 8:
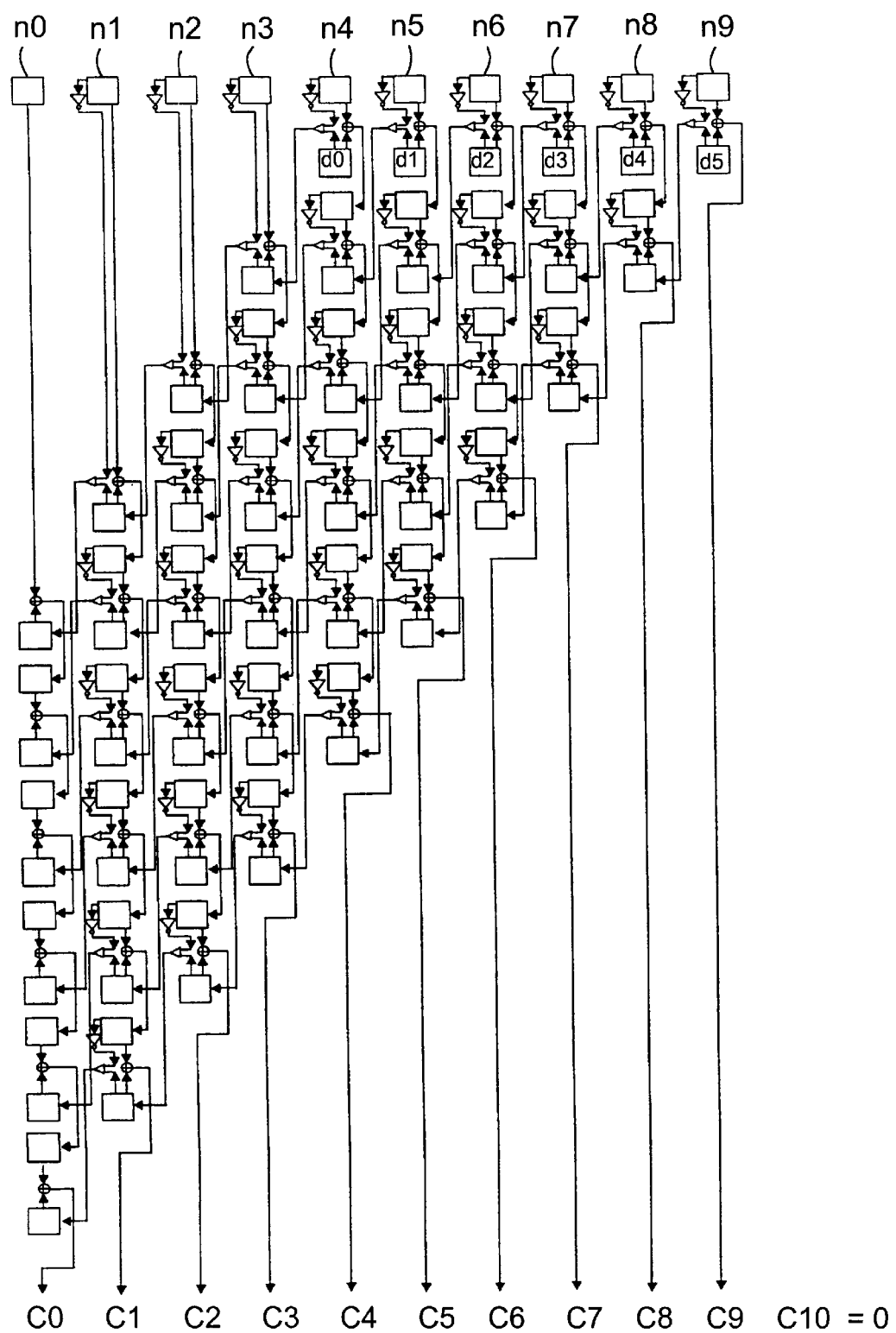
FIG. 8 is a circuit implementing the subtraction of $(d_0, d_1, \ldots, d_5)$ from $(n_0, n_1, \ldots, n_9)$ and multiplying by 2 the result.
Figure 9:
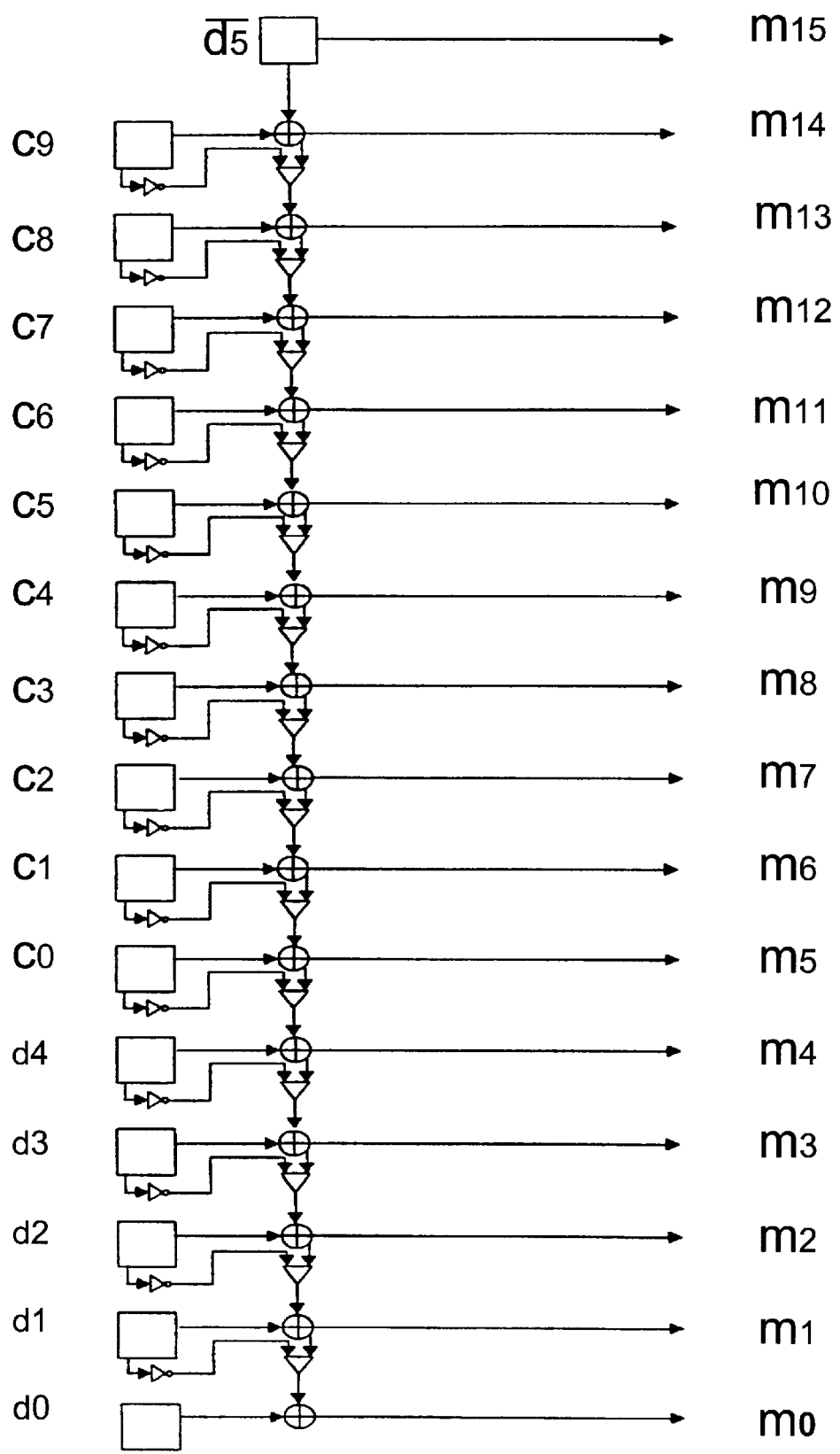
FIG. 9 is a circuit implementing the subtraction of the complement of d5 from (d0, d1, . . . , d4, c0, c1, . . . , c9)

We give the transformation of the vector $\underline{n}$ into an estimate of the input vector $\underline{m}$. The first step is to subtract $(n_{10}, n_{11}, \ldots n_{15})$ from $(n_4, n_5, \ldots n_9)$. The result of this operation is a 6-bit vector $(d_0, d_1, \ldots d_5)$. The circuit implementing this operation is given in FIG. 7. The next step is to subtract $(d_0, d_1, \ldots d_5)$ from $(n_0, n_1, \ldots n_9)$ and attach a 0 at the end. The result is an 11-bit vector $(c_0, c_1, \ldots c_{10})$, where $c_{10}$ is equal to 0. FIG. 8 provides the circuits implementing this operation. Finally, subtract the complement of $\bar{d}_5$ from the 16-bit vector $(d_0, d_1, \ldots d_4, c_0, c_1, \ldots c_{10})$. The result is the final output of the decoder $(m_0, m_1, \ldots m_{15})$. The circuits implementing this operation are given in FIG. 9.

Other Embodiments

The generalized Gray codes described above may be used in a wide variety of apparatuses. In the preferred embodiment, generalized Gray codes are used to write encoded TIDs on disk 50 of FIG. 1. A digital data processing apparatus, such as a personal computer, comprises disk 50 and uses disk 50 for data storage and retrieval. In other embodiments, generalized Gray codes are used whenever data is transmitted and received, and it is desired to have error correcting capability when the data is received.

In a second embodiment, for example, data is transmitted over a transmission line, and code words belonging to a generalized Gray code are transmitted to the transmission line. Identification words, or IDs, are formed from one or more code words, just as TIDs in the preferred embodiment comprise code words $\underline{U}(i)$ and $\underline{X}(j)$. In the second embodiment, IDs are adjacent if they are adjacent in time, in contrast to TIDs, which are adjacent if they are physically proximal.

Figure 10:
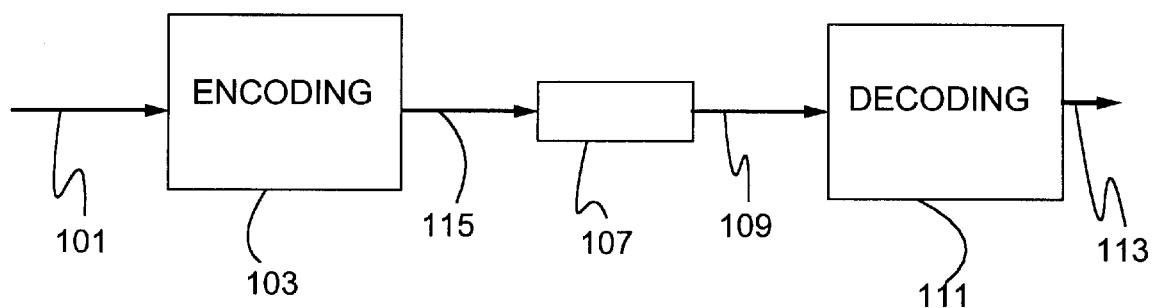
FIG. 10 illustrates an apparatus that uses generalized Gray code.

FIG. 10 illustrates an apparatus that uses generalized Gray code. An encoding unit 103 is electrically connected to a data input 101 and a data output 105. Encoding unit 103 digitally encodes data received from input 101 and outputs generalized Gray code though output 105 onto a medium 107.

A decoding unit 111 is electrically connected to a data input 109 and to a data output 113; decoding unit 111 receives code words of a generalized Gray code from medium 107. Decoding unit 111 receives the code words through input 109, digitally decodes the code words, and outputs the result via data output 113. Medium 107 is any medium capable of transferring the code words from output 105 to input 109, such as a magnetic disk or a transmission line. In one embodiment, the code words are transmitted from output 105 to input 109 via electromagnetic radiation, and medium 107 is unnecessary.

In view of the above, the scope of the invention should be determined by the following claims and their legal equivalents:

What is claimed is:

1. A data storage medium having a plurality of encoded TIDs wherein:
   a first distance between adjacent encoded TIDs is equal to D,
   a second distance between non-adjacent encoded TIDs is greater than or equal to D, and
   a third distance between any two non-adjacent encoded TIDs that lie within a band of M of said encoded TIDs is greater than or equal to 2D;
   wherein D is greater than or equal to 3.

2. The medium of claim 1 wherein each of said TIDs comprises a pair of vectors ($\underline{U}(i)$, $\underline{X}(j)$), wherein $\underline{U}(i)$ is an $i^{th}$ element of a first generalized Gray code, and $\underline{X}(j)$ is a $j^{th}$ element of a second generalized Gray code.

3. The medium of claim 2 wherein D=3 and M=127.

4. The medium of claim 2 wherein:
   said first generalized Gray code is a set of $2^h$ of said code words $\underline{U}(i)$ having p bits and h information bits, where p is greater than h;
   a second generalized Gray code is a set of $2^k$ code words $\underline{X}(j)$ having q bits and k information bits, where q is greater than k; and
   wherein h is greater than or equal to k, and the sum of k and h is n;
   and wherein each of said encoded TIDs comprises:
   one of said code words $\underline{U}(i)$, and
   one of said code words $\underline{X}(j)$
   wherein each encoded TID has n information bits, and
   wherein said encoded TIDs are ordered as follows:
   ($\underline{U}(1),\underline{X}(0)$); ($\underline{U}(1)$, $\underline{X}(1)$); ($\underline{U}(2)\underline{X}(1)$); ($\underline{U}(2),\underline{X}(2)$); . . . ; ($\underline{U}(2^k)$, $\underline{X}(2^k-1)$); ($\underline{U}(2^k),\underline{X}(0)$); ($\underline{U}(2^k+1)$, $\underline{X}(0)$); ($\underline{U}(2^k+1)$); . . . ; ($\underline{U}(2^{k+1})$, ($\underline{X}(2^k-1)$); ($\underline{U}(2^{k+1})$, ($\underline{X}(0)$), ($\underline{U}(2^h-2^k+1)$, $\underline{X}(0)$); ($\underline{U}(2^h-2^k+1)$, $\underline{X}(1)$); . . . ; ($\underline{U}(2^h-1)$); $\underline{X}(2^k-1)$); ($\underline{U}(0)$, ($\underline{X}(2^k-1)$); ($\underline{U}(0)$, $\underline{X}(0)$); ($\underline{U}(3)$, $\underline{X}(0)$); ($\underline{U}(3)$, $\underline{X}(1)$); ($\underline{U}(4)$, $\underline{X}(2)$); . . . ; $\underline{U}(2^k+2)$, $\underline{X}(2^k+2)$, $\underline{X}(2^k-1)$); $\underline{U}(2^k+2)$, $\underline{X}(0)$); ( $\underline{U}(2^k+3)$, $\underline{X}(0)$); ($\underline{U}(2^k+3)$, $\underline{X}(1)$); ($\underline{U}(2^k+4)$, $\underline{X}(1)$); . . . ; ( $\underline{U}(2^{k+1}+2)$, $\underline{X}(2^k-1)$; ($\underline{U}(2^{k+1}2)$; ($\underline{X}(0)$); ($\underline{U}(2^h-2^k+3)$, $\underline{X}(0)$); ($\underline{U}(2^h-2^k+3)$, $\underline{X}(1)$); ($\underline{U}(2^h-2^k+4)$, $\underline{X}(2)$); . . . ; ($\underline{U}(2)$, $\underline{X}(2^k-1)$); ($\underline{U}(2)$, $\underline{X}(0)$); ($\underline{U}(2^k-1)$, $\underline{X}(0)$); ($\underline{U}(2^k-1)$, $\underline{X}(1)$); ( $\underline{U}(2^k)$, $\underline{X}(1)$); . . . ; ($\underline{U}(2^{k+1}-1)$, $\underline{X}(2^k-1)$); ($\underline{U}(2^{k+1}-1)$, $\underline{X}(0)$); ($\underline{U}(2^k+1)$, $\underline{X}(0)$); ($\underline{U}(2^k+1)$, $\underline{X}(1)$); ($\underline{U}(2^{k+1})$, $\underline{X}(1)$); . . . ; ( $\underline{U}(2^{k+2}-1)$, $\underline{X}(2^k-1)$); ($\underline{U}(2^{k+2}-1)$, $\underline{X}(0)$); ($\underline{U}(2^h-1)$, $\underline{X}(0)$); ( $\underline{U}(2^h-1)$, $\underline{X}(1)$); ($\underline{U}(0)$, $\underline{X}(1)$); $\underline{U}(0)$, $\underline{X}(2)$); . . . ; ($\underline{U}(2^k-2)$, $\underline{X}(2^k-1)$); ($\underline{U}(2^k-2)$, $\underline{X}(0)$).

5. The medium of claim 2 wherein said distance D is equal to 3.

6. The medium of claim 1 wherein said data storage medium is a magnetic recording medium having a plurality of data storage tracks.

7. The medium of claim 1 further comprising a servo sector having the plurality of encoded TIDs.

* * * * *